United States Patent [19]
Furuyama et al.

[11] Patent Number: 5,043,597
[45] Date of Patent: Aug. 27, 1991

[54] SUBSTRATE BIAS GENERATION CIRCUIT USED IN SEMICONDUCTOR INTEGRATED CIRCUIT

[75] Inventors: Tohru Furuyama, Tokyo; Hiroto Tanaka, Oobu, both of Japan

[73] Assignee: Kabushiki Kaisha Toshiba, Kawasaki, Japan

[21] Appl. No.: 539,217

[22] Filed: Jun. 18, 1990

[30] Foreign Application Priority Data

Jun. 19, 1989 [JP] Japan .................................. 1-156046

[51] Int. Cl.⁵ .............................................. H03K 3/01
[52] U.S. Cl. ............................. 307/296.2; 307/303.2; 307/482.1; 357/42; 357/23.5
[58] Field of Search ............... 307/296.2, 303.2, 482.1; 357/42, 23.5

[56] References Cited

U.S. PATENT DOCUMENTS

| | | | |
|---|---|---|---|
| 4,430,581 | 2/1984 | Mogi et al. | 307/296.2 |
| 4,491,746 | 1/1985 | Koike | 307/296.2 |
| 4,494,223 | 1/1985 | Reddy et al. | 307/296.2 |
| 4,539,490 | 9/1985 | Ariizumi et al. | 307/296.2 |
| 4,686,388 | 8/1987 | Hafner | 307/296.2 |
| 4,705,966 | 11/1987 | Van Zanten | 307/296.2 |
| 4,791,317 | 12/1988 | Winnerl et al. | 307/296.2 |

FOREIGN PATENT DOCUMENTS

| | | | |
|---|---|---|---|
| 55-71058 | 5/1980 | Japan | 307/296.2 |
| 58-2061 | 1/1983 | Japan | 307/296.2 |

*Primary Examiner*—Andrew J. James
*Assistant Examiner*—Dang Xuan Hung
*Attorney, Agent, or Firm*—Banner, Birch, McKie & Beckett

[57] ABSTRACT

A semiconductor integrated circuit device includes a semiconductor substrate, a semiconductor integrated circuit including the semiconductor substrate, a semiconductor chip having the semiconductor substrate and semiconductor integrated circuit, and a plurality of substrate bias generation circuits arranged on the semiconductor chip in such a manner as to derive substrate bias voltages from a power source voltage supplied from the exterior to the semiconductor chip and uniformly apply the substrate bias voltages over the entire the semicondutor substrate.

21 Claims, 4 Drawing Sheets

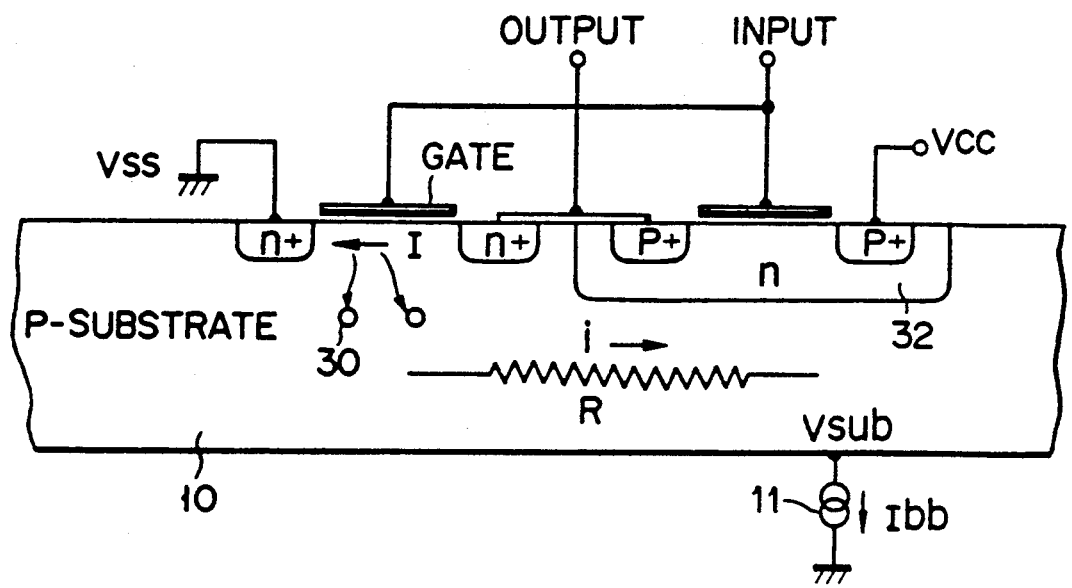
F I G. 1A
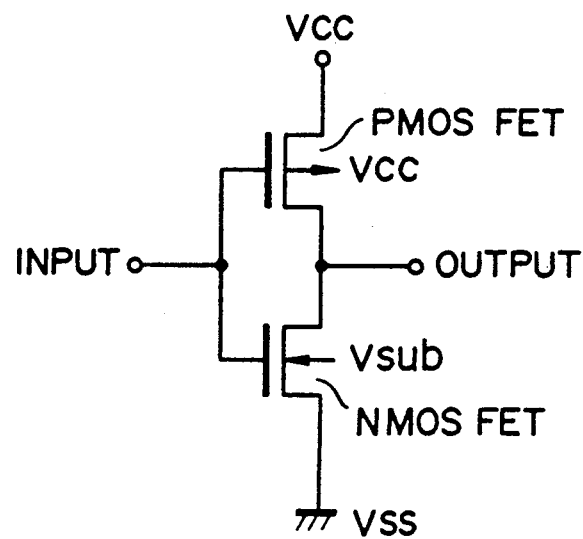
F I G. 1B

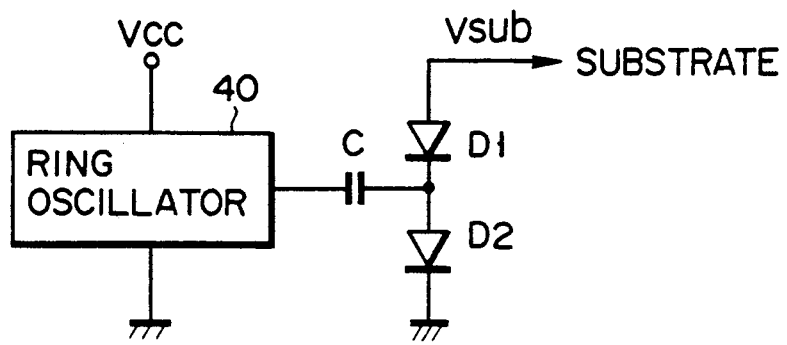
F I G. 2
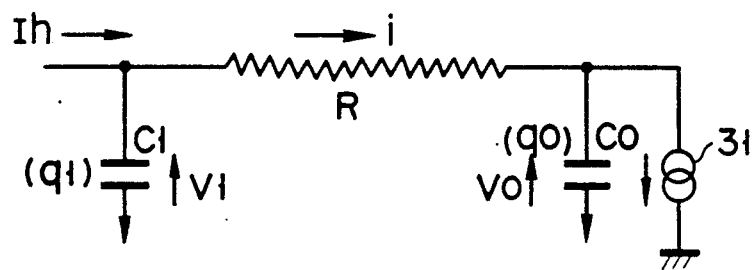
F I G. 3

SUBSTRATE BIAS GENERATION CIRCUIT USED IN SEMICONDUCTOR INTEGRATED CIRCUIT

BACKGROUND OF THE INVENTION

1. Field of the Invention

This invention relates to a semiconductor integrated circuit formed on a chip and having a substrate-bias circuit, and more particularly to a substrate bias generation circuit used in a CMOS DRAM (complementary metal oxide semiconductor dynamic random access memory) of relatively large capacity.

2. Description of the Related Art

In a semiconductor memory using N-channel MOS FETs, for example, the semiconductor substrate is injected holes by impact ionization or the like. FIG. 1A is a cross sectional view of a CMOS inverter and FIG. 1B is a circuit diagram of the CMOS inverter. In FIG. 1A, element 32 denotes n-type semiconductor well area and element 10 denotes p-type semiconductor substrate. As shown in FIGS. 1A and 1B, impact ionization is a phenomenon in which holes 30 are generated by current I which flows in a channel created by a high level voltage applied to the gate of the N-channel MOS FET.

Therefore, as the memory capacity increases and the current in the memory increases, more holes are increasingly injected into the semiconductor substrate. When the holes are injected into the semiconductor substrate, and potential of the substrate is locally rised, junction between n+ area applied Vss level voltage and p-type substrate is forward biased. Therefore, electrons are injected from n+ area into the p-type substrate. The electrons may reach memory cells, and destroy the data in the memory cells, or deteriorate the data retaining characteristic.

Therefore, a substrate bias generation circuit 11 for negatively biasing the substrate is provided for a memory of relatively large capacity, in order to absorb the holes generated by the impact ionization. That is, a substrate bias voltage Vsub (for example, $-2.5$ to $-3$ V) is derived from a power source voltage Vcc (for example, $+5$ V) applied from the exterior to the chip and an output voltage thereof is applied to the semiconductor substrate. The bias circuit includes a ring oscillator, a capacitor C and diodes D1 and D2 as shown in FIG. 2, for example. The holes 30 are attracted by the bias circuit 11 and flow in a resistor R of the substrate as a substrate current i.

In particular when the substrate bias generation circuit is used in a dynamic RAM, it functions to prevent the PN junction of an input section being turned on by the undershoot of an input signal and causing a large amount of electrons to be injected into the substrate, destroying data stored in the memory cell.

However, recently, as the memory capacity and the operation speed of a RAM such as a 4M-bit dynamic RAM are increased, it is required for MOS transistors used in the RAM to drive larger capacitance at a higher operation speed. As a result, the current driving ability of the individual transistor is increased. For example, in the dynamic RAM, a data line restore circuit or data output buffer generates a large current. As a result, a large current flows in the semiconductor integrated circuit chip and the amount of carriers, which are generated by the impact ionization and injected into the semiconductor substrate are increased. In addition, since the chip area is increased, the resistance and capacitance of the semiconductor substrate are also increased.

In FIG. 3, Ih denotes a current caused by holes injected into the semiconductor substrate by impact ionization or the like, R denotes the resistance of the substrate, 31 denotes the substrate bias generation circuit, C0 denotes a capacitor near the substrate bias generation circuit, C1 denotes a capacitor of a circuit positioned at the remotest position from the substrate bias generation circuit, i denotes a substrate current flowing in the substrate, and ibb denotes an absorption current of the bias circuit. As is clearly understood from FIG. 3, since the resistance of the resistor R and the capacitances of the capacitors C0 and C1 are increased as the capacity of the semiconductor integrated circuit is increased, the time constant of the current i becomes larger. Therefore, when a group of circuits lying in an area far from the substrate bias generation circuit 31 on the chip are operated, a time delay caused by the presence of the capacitors C0 and C1 and the resistor R of the semiconductor substrate may occur in a period from when carriers (for example, holes) are injected into the semiconductor substrate until the carriers are absorbed into the substrate bias generation circuit via the resistor R of the semiconductor substrate.

The time delay causes the substrate potential at the remotest area from the substrate bias generation circuit to be set to a potential which temporarily deviates from the potential determined by the substrate bias generation circuit. As a result, the back-gate bias of a MOS transistor lying at the remotest position from the substrate bias generation circuit is temporarily changed. Accordingly, the gate threshold voltage of the MOS transistor is varied. As a result, the noise margin of the circuit is lowered, causing an erroneous operation. Further, the MOS transistor which is formed as an enhancement type is changed into a depletion type, setting the circuit into an inoperative condition.

SUMMARY OF THE INVENTION

An object of this invention is to provide a semiconductor integrated circuit, in a high-speed semiconductor memory, in which the substrate potential of an area in which a large amount of current is generated and causes a large amount of charges to be injected into the semiconductor substrate of a group of circuits can be prevented from transiently and locally deviating from a preset value and the MOS transistor of an enhancement type can be prevented from being changed into a depletion type by the back-gate bias effect, for example, so as to prevent the circuit from being set into an inoperative condition.

In order to attain the above object, there is provided a semiconductor integrated circuit which comprises a semiconductor substrate; a semiconductor integrated circuit formed on the semiconductor substrate; a semiconductor chip having the semiconductor substrate and the semiconductor integrated circuit; and a plurality of substrate bias generation circuits dispersedly arranged on the semiconductor chip, derive a substrate bias voltage from a power source voltage supplied from the exterior to the semiconductor chip, and apply the substrate bias voltage to the semiconductor substrate or well area so as to uniformly apply the bias voltage to the semiconductor integrated circuit.

According to this invention, a plurality of substrate bias generation circuits are arranged in their respective areas of the chip. Thus, since the resistance and capacitance of each of the semiconductor substrate areas allocated to the respective substrate bias generation circuits are reduced, the time constant of a current flowing in the area becomes smaller than the time constant in the prior art case, thereby ensuring that the stability of the substrate potential can be attained on the entire portion of the semiconductor integrated circuit. Therefore, in a semiconductor integrated circuit such as a 4M-bit dynamic RAM which is required to have a large capacity and high operation speed, a stable substrate bias voltage can be applied over the entire portion of the integrated circuit. As a result, the back-gate bias voltages of MOS transistors formed on the semiconductor substrate will not vary, thereby ensuring a stable transistor operation and significantly enhancing the operation margin of the circuit. Further, in a CMOS integrated circuit, a stable substrate bias voltage is applied to the entire portion of the semiconductor integrated circuit so that a bipolar action starting voltage characteristic of the PN junction of the semiconductor in the entire portion of the semiconductor integrated circuit can be improved. Therefore, the anti-latch-up characteristic against the undershoot of an input signal can be significantly improved. Further, the width of the depletion layer of the PN junction in the entire portion of the semiconductor circuit is enlarged by the substrate bias generation circuit of this invention, thus reducing the capacitance of the PN junction.

Additional objects and advantages of the invention will be set forth in the description which follows, and in part will be obvious from the description, or may be learned by practice of the invention. The objects an advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A and 1B are a cross sectional view and a circuit diagram of a CMOS inverter;

FIG. 2 is a diagram showing a substrate bias circuit;

FIG. 3 is an equivalent circuit diagram showing a semiconductor substrate and a substrate bias generation circuit on the chip of a dynamic RAM;

DETAILED DESCRIPTION OF THE PREFERRED EMBODIMENTS

Figure 4:
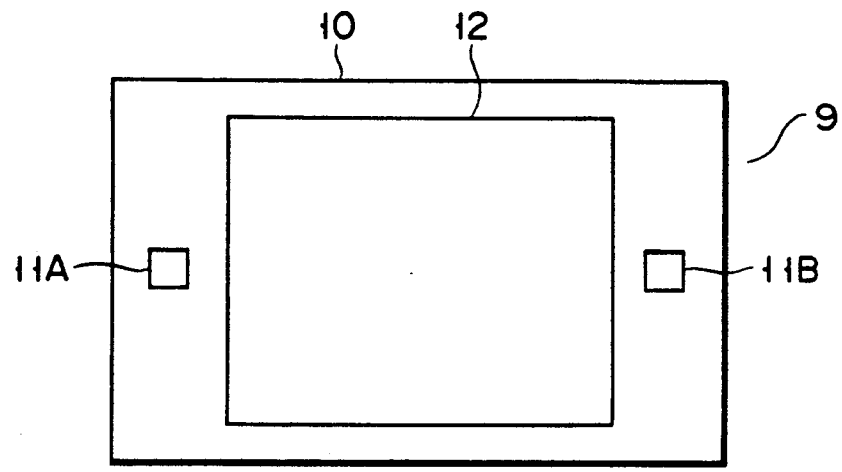
FIG. 4 is a diagram showing the arrangement of the substrate bias generation circuit on the chip of a dynamic RAM according to a first embodiment of this invention.

There will now be described in detail a preferred embodiment of this invention, with reference to the accompanying drawings. The actual construction of a substrate bias generation circuit is shown in FIG. 4, wherein a semiconductor chip 9 in which, for example, two substrate bias generation circuits 11A and 11B are arranged on either side of a semiconductor integrated circuit 12 (for example, memory cell array) on a semiconductor substrate 10 of a CMOS dynamic RAM. In FIG. 4, the two substrate bias generation circuits 11A and 11B are arranged in their respective areas, which are calculated by dividing the chip 9 into two substantially equal portions. For example, as shown in FIG. 4, the substrate bias generation circuits 11A and 11B are arranged on both sides of the semiconductor integrated circuit 12 which is disposed on substantially the central portion of the semiconductor substrate 10. In this case, it is preferable to arrange the substrate bias generation circuits 11A and 11B so that the distances between the bias circuits and the remotest portions, from the bias circuits, of the respective areas allocated to the bias circuits in the integrated circuit 12 can be equal to each other. As a result, the substrate bias voltage can be substantially uniformly applied over the entire portion of the semiconductor integrated circuit 12.

Further, a MOS transistor (not shown) which acts as an enhancement type transistor in a normal operation mode (when a normal substrate bias voltage is applied to the semiconductor substrate of the chip) is formed on the semiconductor substrate.

In the above dynamic RAM, it is necessary to make the two substrate bias generation circuits 11A and 11B large enough to fully absorb carriers generated by impact ionization or the like in an area far from the substrate bias generation circuits 11A and 11B. Under this condition, at the time of operation of the RAM, variation in the potential of the semiconductor substrate, not only near the substrate bias generation circuits but also far from the substrate bias generation circuits 11A and 11B, can be suppressed.

Figure 6:
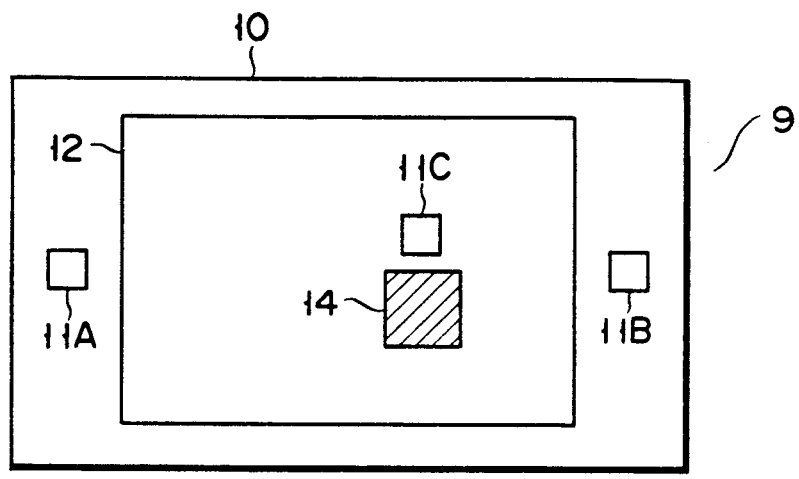
FIG. 6 is a diagram showing the arrangement of the substrate bias generation circuit on the chip of a dynamic RAM according to a second embodiment of this invention.

Further, in a second embodiment, if one of the substrate bias generation circuits is provided near an area in which a circuit group (for example, a circuit group such as a data line restore circuit or data output buffer in a dynamic RAM which generates a large current), generates a large current to inject a large amount of charges into the semiconductor substrate, the substrate potential of the area ca be prevented from transiently and locally deviating from a preset potential. FIG. 6 shows this case, and a hatching portion 14 indicates the circuit group which generates a large current and IIC denotes a bias generation circuit newly disposed for the circuit group.

That is, variation in the potential of the semiconductor substrate of the entire portion of the semiconductor integrated circuit 12 can be suppressed by means of the plurality of substrate bias generation circuits. Further, the enhancement type MOS transistor can be prevented from being changed into a depletion type so as to prevent the circuit from being rendered inoperative.

Figure 5:
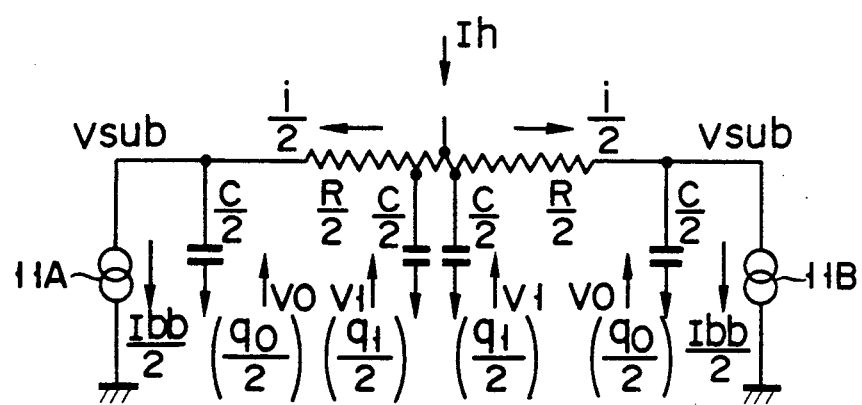
FIG. 5 shows an equivalent circuit of FIG. 4.

In order to numerically express the effect of this invention, the time constant of the current flowing in the semiconductor substrate is derived with reference to FIGS. 3 and 5. In FIG. 3, R denotes a resistor of the semiconductor substrate, C0 and C1 respectively denote capacitors provided near the substrate bias generation circuit 31 and in an area of the remotest point from the bias generation circuit 31, q0 and q1 respectively denote charges stored on the capacitors C0 and C1, V0 and V1 respectively denote voltages generated across the capacitors C0 and C1, Ih indicates a current caused by carriers which are generated by the impact ionization or the like and injected into the semiconductor substrate when the circuit group at the remotest are from the substrate bias generation circuit 31 is operated, Ibb indicates an absorption current of the substrate bias generation circuit 31, and i indicates a substrate current or a current flowing in the resistor R. The relations between the above values are expressed as follows:

$$V1 - Ri - V0 = 0 \quad (1)$$

$$q1 = C1 V1 \quad (2)$$

$$q0 = C0 V0 \quad (3)$$

$$dq1/dt = I - i \quad (4)$$

$$dq0/dt = i - Ibb \quad (5)$$

From Eqs. (1), (2) and (3), the following equation can be obtained:

$$\begin{aligned} i &= (V1 - V0)/R \\ &= \{(q1/C1) - (q0/C0)\}/R \end{aligned} \quad (6)$$

The following equation can be derived by differentiating Eq. (6) with respect to t and substituting Eqs. (4) and (5):

$$\begin{aligned} di/dt &= [\{(I - i)/C1\} - \{(i - Ibb)/C0\}]/R \\ &= \{(-1/C1R) - (1/C0R)\}i + \\ &\quad \{(I/C1R) + (Ibb/C0R)\} \end{aligned}$$

Assuming that C1 = C0 = C, the following equation can be obtained:

$$di/dt = (-2/CR)i + (I + Ibb)/CR \quad (7)$$

Further, assuming that $(-2/C\,R) = A$ and $(Ih + Ibb)/C\,R = B$, then the following equation can be obtained:

$$di/dt = Ai + B \quad (<0) \quad (8)$$

By solving the differential equation (8), the following equation can be derived:

$$i = -(\epsilon^{-AK}A)\epsilon^{At} - B/A \quad (9)$$

where K is an integration constant. Eq. (9) can be modified as follows:

$$i = P\epsilon^{(-2/CR)t} - B/A \quad (10)$$

where $P = -\epsilon^{AK}/A$.

Therefore, the time constant T0 of the current i, flowing in the resistor of the semiconductor substrate in the dynamic RAM shown in FIG. 3, can be expressed as follows:

$$T0 = C \cdot R/2$$

That is, the time constant T0 is a function of the capacitance C and resistance R of the semiconductor substrate.

Next, the time constant of a current flowing in the substrate in one embodiment of this invention, in which two substrate bias circuits are formed in the semiconductor integrated circuit, is derived with reference to FIG. 5, shows a circuit equivalent to that of FIG. 4. In FIG. 5, C/2 indicates capacitors of the semiconductor substrate which are provided near the substrate bias generation circuits 11A and 11B and at the remotest and substantially the same distant point from the substrate bias generation circuits 11A and 11B, R/2 indicates the resistor of the semiconductor substrate from the two substrate bias generation circuits 11A and 11B to the remotest point, q0/2 and V0 respectively denote the amount of charges stored in the capacitor C/2 of the semiconductor substrate provided near the substrate bias generation circuits 11A and 11B and a voltage generated across the capacitor C/2, and Ih indicates carriers (current) which are generated and injected into the semiconductor substrate when the circuit group at the remotest and substantially the same distant area from the substrate bias generation circuits 11A and 11B is operated. The above carriers are carriers such as holes which are generated by impact ionization or the like. i/2 denotes a substrate current flowing in each of the substrate resistors R/2.

With the above relation taken into consideration, the time constant T of the substrate current i/2 can be derived based on Eqs. (1) to (10) as follows:

$$T = (C/2) \cdot (R/2)/2 = (C \cdot R/4)/2$$

Therefore, the following equation can be obtained:

$$T = T0/4.$$

That is, in the dynamic RAM of FIG. 4. the two substrate bias generation circuits 11A and 11B are arranged to be allocated equally divided areas of the chip. In this case, each of the areas of the chip on which substrate bias generation circuits 11A and 11B are disposed has an area substantially one half that of the area on the integrated circuit on which a single substrate bias generation circuit of FIG. 3 is formed. As a result, since the resistance and capacitance of each of the areas on which the substrate bias generation circuits 11A and 11B are respectively arranged are reduced to ½, the time constant T of the substrate current i/2 can be reduced to ¼ of that of a conventional case, thereby significantly improving the stability of the substrate potential.

Two or three substrate bias generation circuits ar utilized in the above embodiment. However, it is also possible to utilize four or more substrate bias generation circuits, and in this way, the stability of the substrate potential can be further improved. In this case, it is preferable to arrange substrate bias generation circuits on equally divided areas of the integrated circuit 12. That is, it is preferable to uniformly arrange the substrate bias generation circuits such that the distances between the bias circuits and the remotest areas, from the bias circuits, in the area allocated to the bias circuits can be set substantially equal to one another.

Figure 7:
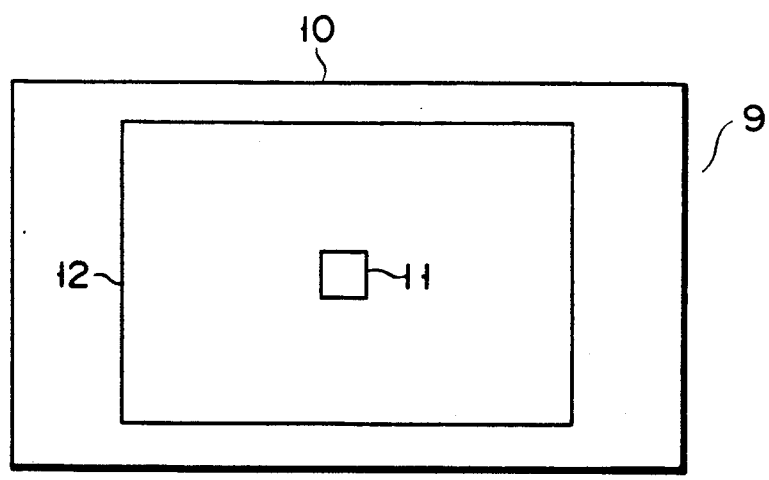
FIG. 7 is a diagram showing the arrangement of the substrate bias generation circuit on the chip of a dynamic RAM according to a third embodiment of this invention.

Further, as shown in FIG. 7, the same effect can be obtained when the substrate bias circuit 11 is arranged at substantially the central portion of the semiconductor integrated circuit 12 to reduce the distance from the bias circuit 11 to the remotest area.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A MOS memory device comprising:
   a semiconductor substrate;
   a MOS memory integrated circuit for storing data formed on said semiconductor substrate; and
   a plurality of substrate bias voltage generating circuits for generating substrate bias volt ages to apply a desired potential to said semiconductor substrate and for absorbing surplus carries which are injected into said semiconductor substrate from said MOS memory integrated circuit, said substrate bias voltage generating circuits being arranged so as to minimize fluctuations of the desired substrate potential due to surplus carriers injected into said substrate from said MOS integrated circuit.

2. A MOS memory device according to claim 1, wherein said semiconductor integrated circuit includes CMOS memory cells.

3. A MOS memory device according to claim 1, wherein said semiconductor integrated circuit includes CMOS inverters.

4. A MOS memory device according to claim 1, wherein said plurality of substrate bias voltage generation circuits are arranged to be allocated two divided substantially equal areas of said semiconductor integrated circuit.

5. A MOS memory device according to claim 1, wherein at least one of said plurality of substrate bias generation circuits is arranged near an area of said semiconductor integrated circuit in which current is relatively concentrated.

6. A MOS memory device according to claim 1, wherein said plurality of substrate bias voltage generating circuits each comprise a ring oscillator having an output, first and second diodes having respective anodes and cathodes, and a capacitor having first and second terminals, the first terminal of said capacitor being connected to the output of said ring oscillator, the cathode of said first diode being connected to the second terminal of said capacitor, the anode of said second diode being connected to the second terminal of said capacitor, the anode of said first diode being connected to said semiconductor substrate, and the cathode of said second diode being connected to a ground of said semiconductor integrated circuit.

7. A MOS memory device according to claim 1, wherein said substrate bias voltage generating circuits are positioned such that a distance from a first bias voltage generating circuit to a portion of said semiconductor integrated circuit furthest from said first bias voltage generating circuit is substantially equal to a distance from a second bias voltage generating circuit to a portion of said semiconductor integrated circuit further from said second bias voltage generating circuit.

8. A MOS memory device comprising:
   a semiconductor substrate;
   a MOS memory integrated circuit for storing data formed in said semiconductor substrate; and
   a substrate bias voltage generating circuit for generating a a substrate bias voltage to apply a desired potential to said semiconductor substrate and for absorbing surplus carriers which are injected into said semiconductor substrate from said MOS memory integrated circuit, said substrate bias voltage generating circuit being arranged substantially at a central portion of said MOS memory integrated circuit.

9. A MOS memory device comprising:
   a semiconductor substrate having a first conductivity type; semiconductor well areas having a second conductivity type formed in a surface region of said semiconductor substrate;
   a MOS memory integrated circuit including CMOS transistors formed in said semiconductor well areas and said semiconductor substrate, and
   a plurality of substrate bias voltage generating circuits for generating substrate bias voltages to apply a desired potential to said semiconductor substrate and said semiconductor well areas and for absorbing surplus carriers which are injected into said semiconductor well areas from said MOS memory integrated circuit, said bias voltage generating circuits being arranged so as to minimize fluctuation of the desired potential due to the surplus carriers injected into said semiconductor substrate from said MOS memory integrated circuit.

10. A MOS memory device device according to claim 9, wherein said semiconductor integrated circuit includes CMOS memory cells.

11. A CMOS memory device device according to claim 9, wherein said semiconductor integrated circuit includes CMOS inverters.

12. A MOS memory device device according to claim 9, wherein said plurality of substrate bias voltage generation circuits are arranged to be allocated two divided substantially equal areas of said semiconductor integrated circuit.

13. A MOS memory device device according to claim 9, wherein at least one of said plurality of substrate bias generation circuits is arranged near that area of said semiconductor integrated circuit in which current is relatively concentrated.

14. A MOS memory device according to claim 9, wherein said plurality of substrate bias voltage generating circuits each comprise a ring oscillator having an output, first and second diodes having respective anodes and cathodes, and a capacitor having first and second terminals, the first terminal of said capacitor being connected to the output of said ring oscillator, the cathode of said first diode being connected to the second terminal of said capacitor, the anode of said second diode being connected to the second terminal of said capacitor, the anode of said first diode being connected to said semiconductor substrate, and the cathode of said second diode being connected to a ground of said semiconductor integrated circuit.

15. A MOS memory device according to claim 9, wherein said substrate bias voltage generating circuits are positioned such that a distance from a first bias voltage generating circuit to a portion of said semiconductor integrated circuit furthest from said first bias voltage generating circuit is substantially equal to a distance from a second bias voltage generating circuit to a portion of said semiconductor integrated circuit furthest from said second bias voltage generating circuit.

16. A MOS memory device comprising:
   a semiconductor substrate having a first conductivity type;
   semiconductor well areas having a second conductivity type formed in a surface region of said semiconductor substrate;

a MOS memory integrated circuit including CMOS transistors formed in said semiconductor well areas and said semiconductor substrate; and a substrate bias voltage generating circuit for generating a substrate bias voltage to apply a desired potential to said semiconductor well areas and said semiconductor substrate and for absorbing surplus carriers which are injected into said semiconductor well areas due to operation of said MOS memory integrated circuit, said bias voltage generating circuit being arranged at substantially a central portion of said MOS memory integrated circuit.

17. A semiconductor integrated circuit comprising:

a semiconductor substrate having an internal resistance and capacitance;

a semiconductor integrated circuit formed on said semiconductor substrate; and a plurality of substrate bias voltage generating circuits positioned on said semiconductor substrate and generating substrate bias voltages for applying a desired potential to said semiconductor substrate, said substrate bias voltage generating circuits being positioned to minimize a time constant of said semiconductor substrate determined by the internal resistance and capacitance of said semiconductor substrate such that a time from when surplus carriers are injected into said substrate form said semiconductor integrated circuit until said surplus carriers are absorbed by one of said substrate bias voltage voltage generating circuits is substantially minimized, thereby reducing fluctuation of the desired potential.

18. The semiconductor integrated circuit device according to claim 17, wherein said substrate bias voltage generating circuits are positioned such that a distance from a first bias voltage generating circuit to a portion of said semiconductor integrated circuit furthest from said first bias voltage generating circuit is substantially equal to a distance from a second bias voltage generating circuit to a portion of said semiconductor integrated circuit furthest from said second bias voltage generating circuit.

19. The semiconductor integrated circuit device according to claim 18, wherein said bias voltage generating circuits each comprise a ring oscillator having an output, first and second diodes having respective anodes and cathodes, and a capacitor having first and second terminals, the first terminal of said capacitor being connected to the output of said ring oscillator, the cathode of said first diode being connected to the second terminal of said capacitor, the anode of said second diode being connected to the second terminal of said capacitor, the anode of said first diode being connected to said semiconductor substrate, and the cathode of said second diode being connected to a ground of said semiconductor integrated circuit.

20. The semiconductor integrated circuit device according to claim 18, wherein said semiconductor integrated circuit device includes CMOS memory cells.

21. The semiconductor integrated circuit device according to claim 18, wherein said semiconductor integrated circuit device includes CMOS inverters.

* * * * *